United States Patent [19]
Perng et al.

[11] Patent Number: 6,149,987
[45] Date of Patent: Nov. 21, 2000

[54] METHOD FOR DEPOSITING LOW DIELECTRIC CONSTANT OXIDE FILMS

[75] Inventors: Dung-Ching Perng, San Jose; Peter Wai-Man Lee, Fremont; Thomas E. Deacon, Sunnyvale, all of Calif.

[73] Assignee: Applied Materials, Inc., Santa Clara, Calif.

[21] Appl. No.: 09/075,592

[22] Filed: Apr. 7, 1998

[51] Int. Cl.[7] .............................. H05H 1/24; C23C 16/40
[52] U.S. Cl. .................. 427/579; 427/539; 427/255.37; 427/255.7
[58] Field of Search ...................... 427/579, 578, 427/255.7, 539, 255.29, 255.37

[56] References Cited

U.S. PATENT DOCUMENTS

| | | | |
|---|---|---|---|
| 4,851,370 | 7/1989 | Doklan et al. | 437/225 |
| 4,971,655 | 11/1990 | Stefano et al. | 156/659 |
| 4,992,306 | 2/1991 | Hochberg et al. | 427/255.3 |
| 5,271,972 | 12/1993 | Kwok et al. | 427/579 |
| 5,356,722 | 10/1994 | Nguyen et al. | 427/569 |
| 5,393,708 | 2/1995 | Hsia et al. | 437/228 |
| 5,426,076 | 6/1995 | Moghadam | 437/238 |
| 5,461,003 | 10/1995 | Havemann et al. | 437/187 |
| 5,470,802 | 11/1995 | Gnade et al. | 437/238 |
| 5,484,749 | 1/1996 | Maeda et al. | 437/238 |
| 5,486,492 | 1/1996 | Yamamoto et al. | 437/192 |
| 5,488,015 | 1/1996 | Havemann et al. | 437/195 |
| 5,494,858 | 2/1996 | Gnade et al. | 437/231 |
| 5,504,042 | 4/1996 | Cho et al. | 437/247 |
| 5,525,551 | 6/1996 | Ohta | 437/238 |
| 5,536,681 | 7/1996 | Jang et al. | 437/195 |
| 5,554,570 | 9/1996 | Maeda et al. | 437/235 |
| 5,561,318 | 10/1996 | Gnade et al. | 257/638 |
| 5,571,576 | 11/1996 | Qian et al. | 427/574 |
| 5,660,895 | 8/1997 | Lee et al. | 427/579 |
| 5,668,398 | 9/1997 | Havemann et al. | 257/522 |
| 5,753,564 | 5/1998 | Fukada | 437/238 |
| 5,789,819 | 8/1998 | Gnade et al. | 257/759 |

OTHER PUBLICATIONS

F. Gaillard et al., "Silicon Dioxide Chemical Vapor Deposition Using Silane and Hydrogen Peroxide," *J. Vac. Sci. Technol. B.*, vol. 14, No. 4, No. 4, pp. 2767–2769 (Jul./Aug. 1996).

S. Mokhtari et al., "Mechanisms of Deposition of $SiO_2$ from TEOS and Related Organosilicon Compounds and Ozone," *J. Electrochem. Soc.*, vol. 142, No. 7, pp. 2332–2340 (Jul. 1995).

K. Kwok et al., "Surface Related Phenomena in Integrated PECVD/Ozone–TEOS SACVD Processes for Sub–Half Micron Gap Fill: Electrostatic Effects," *J. Electrochem. Soc.*, vol. 141, No. 8, pp. 2172–2177 (Aug. 1994).

J.G. Lee et al., "SACVD: A New Approach for 16Mb Dielectrics," *Semiconductor International*, pp. 116–120 (May 1992).

K. Kishimoto et al., "Planarized $SiO_2$ Interlayer Formed by Two Step $O_3$/TEOS APCVD and Low Temperature Annealing," *Proceedings of the International VLSI Multilevel Interconnection Conference, VMIC Conference, Santa Clara, CA—Jun. 9–10, 1992*, pp. 149–155.

K. Fujino et al., "Surface Modification of Base Materials for $TEOS/O_3$ Atmospheric Pressure Chemical Vapor Deposition," *J. Electrochem. Soc.*, vol. 139, No. 6, pp. 1690–1692 (Jun. 1992).

N. Sato et al., "Improvement of Gap–Filling Property of $O_3$–tetraethylorthosilicate (TEOS) Film by Ethanol Surface Treatment," *Jpn. J. Appl. Phys.*, vol. 32, part 2, No. 1A/B, pp. 110–112 (1993).

M. Saito et al., "Pressure–Controlled Two–Step TEOS–$O_3$ CVD Eliminating the Base Material Effect," *1995 Symposium on VLSI Technology Digest of Technical Papers*, pp. 43–44 (1995).

K. Fujino et al., "Dependence of Deposition Characteristics on Base Materials in TEOS and Ozone CVD at Atmospheric Pressure," *J. Electrochem. Soc.*, vol. 138, No. 2, pp. 550–554 (Feb. 1991).

*Primary Examiner*—Roy V. King
*Attorney, Agent, or Firm*—Townsend Townsend & Crew

[57] ABSTRACT

A composite silicon dioxide layer with a reduced dielectric constant is formed by enhancing the surface sensitivity of a PECVD liner layer with activated oxygen. Pores form in an SACVD layer of silicon dioxide deposited from a TEOS precursor over the sensitized PECVD layer. The pores reduce the dielectric constant of the composite layer. Activated oxygen is provided to the PECVD layer in the form of ozone or an oxygen-based plasma.

14 Claims, 10 Drawing Sheets

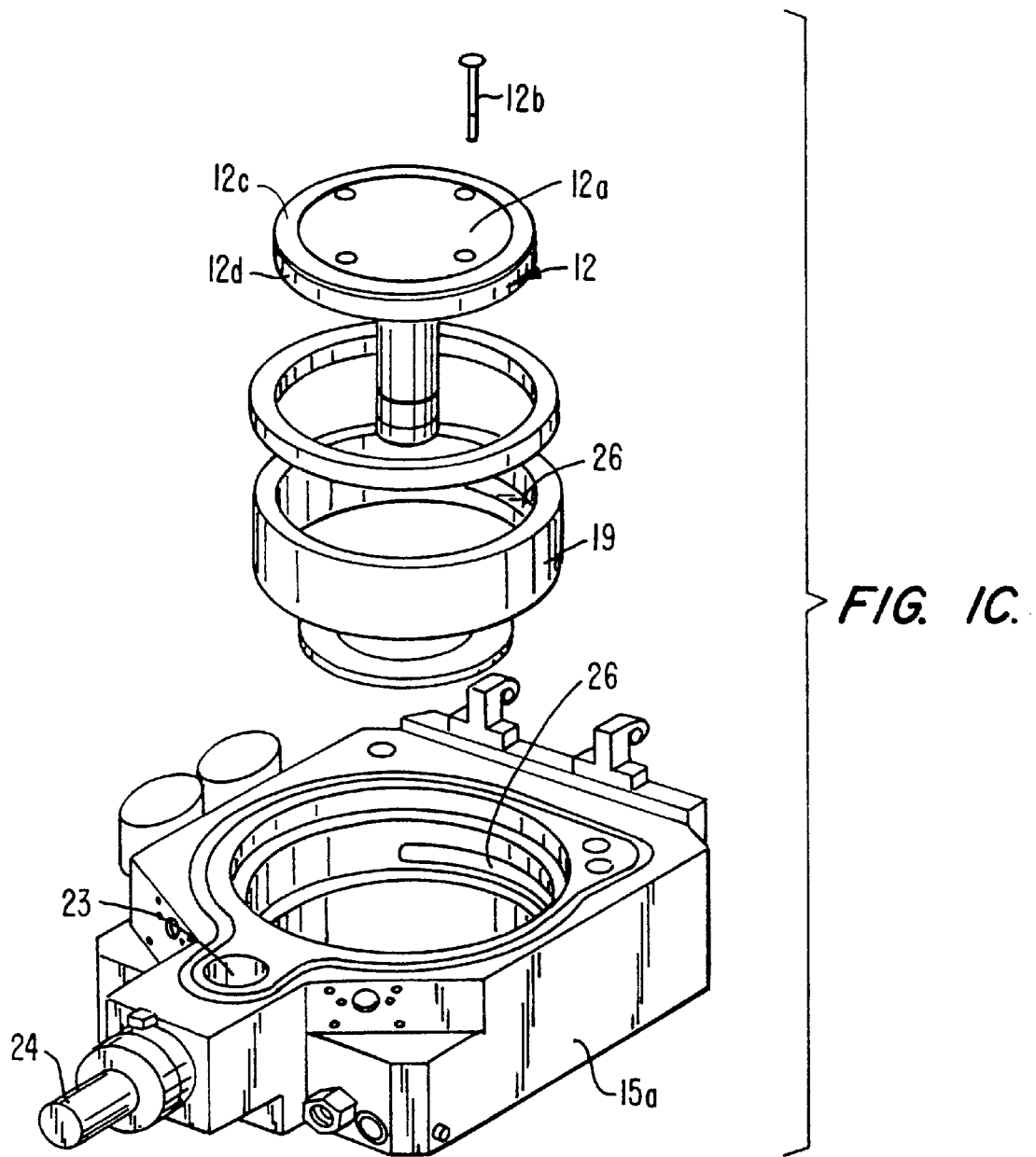

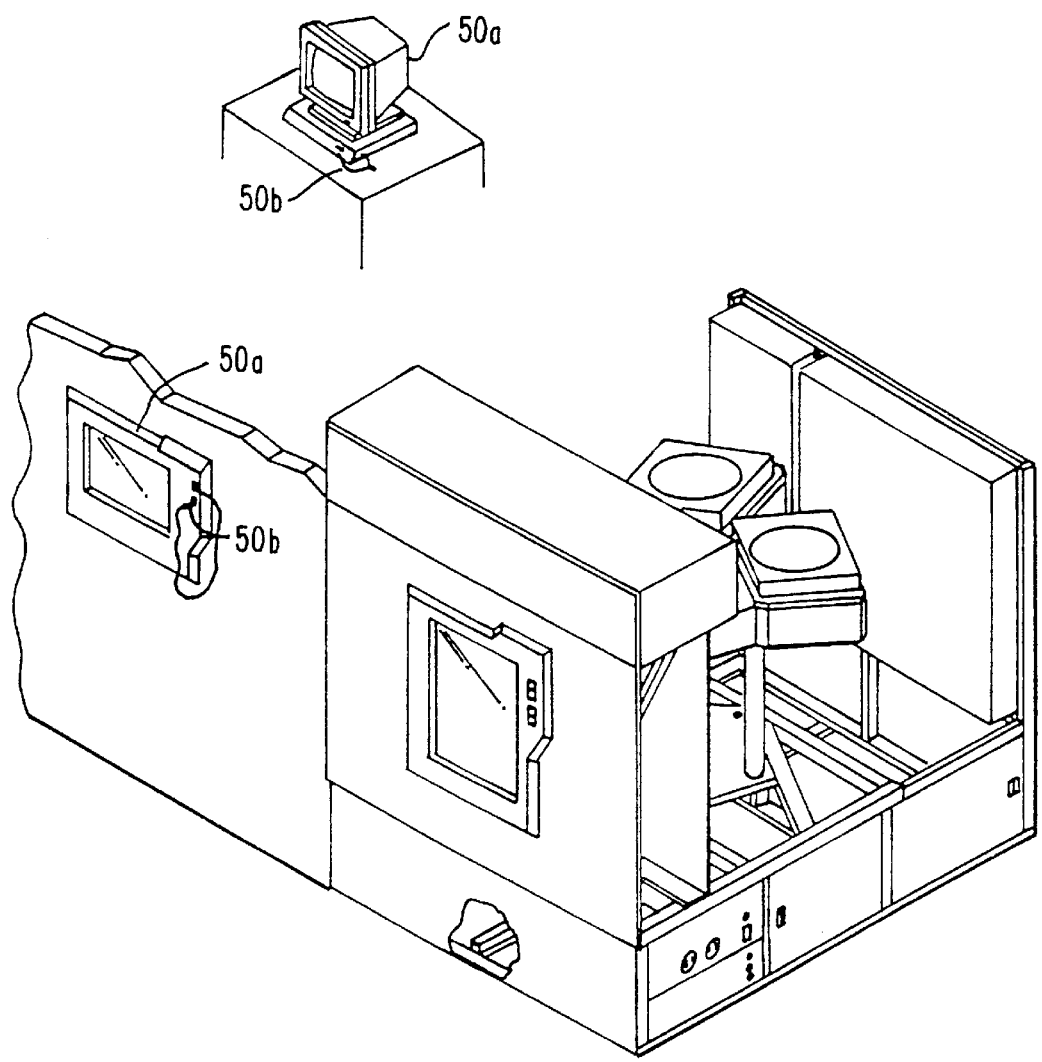
FIG. IE.

METHOD FOR DEPOSITING LOW DIELECTRIC CONSTANT OXIDE FILMS

BACKGROUND OF THE INVENTION

The present invention relates to the deposition of dielectric layers during wafer processing and more specifically to a method and apparatus for forming an interconductor oxide layer having a low dielectric constant.

One of the primary steps in the fabrication of modern semiconductor devices is the formation of a thin film on a semiconductor substrate by a chemical vapor deposition (CVD) process. There are different types of CVD processes, such as plasma-enhanced CVD (PECVD) processes and thermal CVD processes. In a typical PECVD process, a plasma of reactive species is formed from gases and the reactive species form a film on the substrate. In a typical thermal CVD process, gases react on a heated surface of a substrate to form the desired film. Each type of CVD process has attributes that may be desirable or undesirable for different applications, and it may be desirable to sequentially use both types of processes to take advantage of a combination of their beneficial attributes.

Semiconductor device geometries have dramatically decreased in size since integrated circuits were first introduced several decades ago. Since then, the number of devices that will fit on an integrated circuit, or chip, of a given size has regularly doubled every year or two. Today's wafer fabrication plants are routinely producing devices with 0.35-micron feature sizes, and tomorrow's plants soon will be producing devices having even smaller geometries.

As device sizes become smaller and integration density increases, new problems arise that were not as important with the former technology. For example, the problem of interlevel "crosstalk", which is the undesired coupling of an electrical signal on one metal layer onto another metal layer, arose with the advent of multilevel metal technology, in which two or more layers of metal with intervening insulating, or dielectric, layers are formed on a semiconductor substrate. Crosstalk can be reduced by moving the metal layers further apart, minimizing the areas of overlapping metal between metal layers, reducing the dielectric constant of the material between metal layers, and combinations of these and other methods.

Undesired coupling of electrical signals can also occur between adjacent conductive traces, or lines, within a conductive layer. As device geometries shrink, the conductive lines become closer together and it becomes more important to isolate them from each other.

Another issue rising in importance with decreasing geometry is the "RC time constant" of a particular trace. Each trace has a resistance, R, that is a product of its cross section and bulk resistivity, among other factors, and a capacitance, C, that is a product of the surface area of the trace and the dielectric constant of the material or space surrounding the trace, among other factors. If a voltage is applied to one end of the conductive trace, charge does not immediately build up on the trace because of the RC time constant. Similarly, if a voltage is removed from a trace, the trace does not immediately drain to zero. Thus, high RC time constants can slow down the operation of a circuit. Unfortunately, shrinking circuit geometries produce narrower traces, which results in a higher resistivity. Therefore it is important to reduce the capacitance of the trace, such as by reducing the dielectric constant of the surrounding material or material between traces, to maintain or reduce the RC time constant.

Many approaches have been proposed for obtaining lower dielectric constants. One approach incorporates a halogen, such as fluorine, into a silicon oxide layer to form a silicon-oxygen-halogen network. It is believed that fluorine, a highly electronegative species, lowers the dielectric constant of the resulting layer by decreasing the polarizability of the silicon-oxygen-fluorine network. However, using fluorine might cause problems, such as corrosion, in some applications. Therefore, in some instances it is desirable to lower the dielectric constant of a dielectric layer on a semiconductor substrate without using a halogen, or to use even further lower the dielectric constant by using a halogen in combination with other methods.

SUMMARY OF THE INVENTION

The present invention provides a method and an apparatus for producing a low-dielectric-constant layer for use between conductive traces and/or between conductive layers of a semiconductor device. Specifically, the present invention achieves a low-dielectric-constant layer of silicon oxide by intentionally introducing porosity into the layer using a combination of deposition techniques and an intervening surface treatment.

According to one aspect of the invention, a first layer of silicon oxide is formed on a substrate using a PECVD process, the surface of the first layer is treated with activated oxygen to enhance its surface sensitivity, and a second layer of silicon oxide is deposited using a thermal CVD method, such as a subatmospheric CVD (SACVD) method. A hydrophobic silicon source, such as tetraethylorthosilane (TEOS), is used during the thermal CVD method to form a porous layer of SACVD silicon oxide. In one embodiment of the invention, the surface sensitivity of the PECVD layer is enhanced by exposing the surface to ozone ($O_3$) for a period of time. In another embodiment, the surface sensitivity is enhanced by exposing the surface to an oxygen-based plasma of the proper density and intensity to eliminate dangling silicon bonds on the surface of the PECVD layer.

In a further embodiment, fluorine is incorporated into the PECVD layer to reduce the dielectric constant of that layer and to enhance the hydrophilic characteristics of the surface of that layer. The SACVD layer may be thermally or plasma-treated after formation to improve the quality of the surface of the SACVD layer, and a capping layer may be deposited over the SACVD layer in addition, or as an alternative, to the surface treatment of the SACVD layer.

For a further understanding of the objects and advantages of the present invention, reference should be made to the ensuing detailed description taken in conjunction with the accompanying drawings.

BRIEF DESCRIPTION OF THE DRAWINGS

FIGS. 1C and 1D are exploded perspective views of parts of the CVD chamber depicted in FIG. 1A;

FIG. 1E is a simplified diagram of system monitor and the CVD system in a multichamber system, which may include one or more chambers;

DESCRIPTION OF THE PREFERRED EMBODIMENT

I. Exemplary CVD System

Figure 1A:
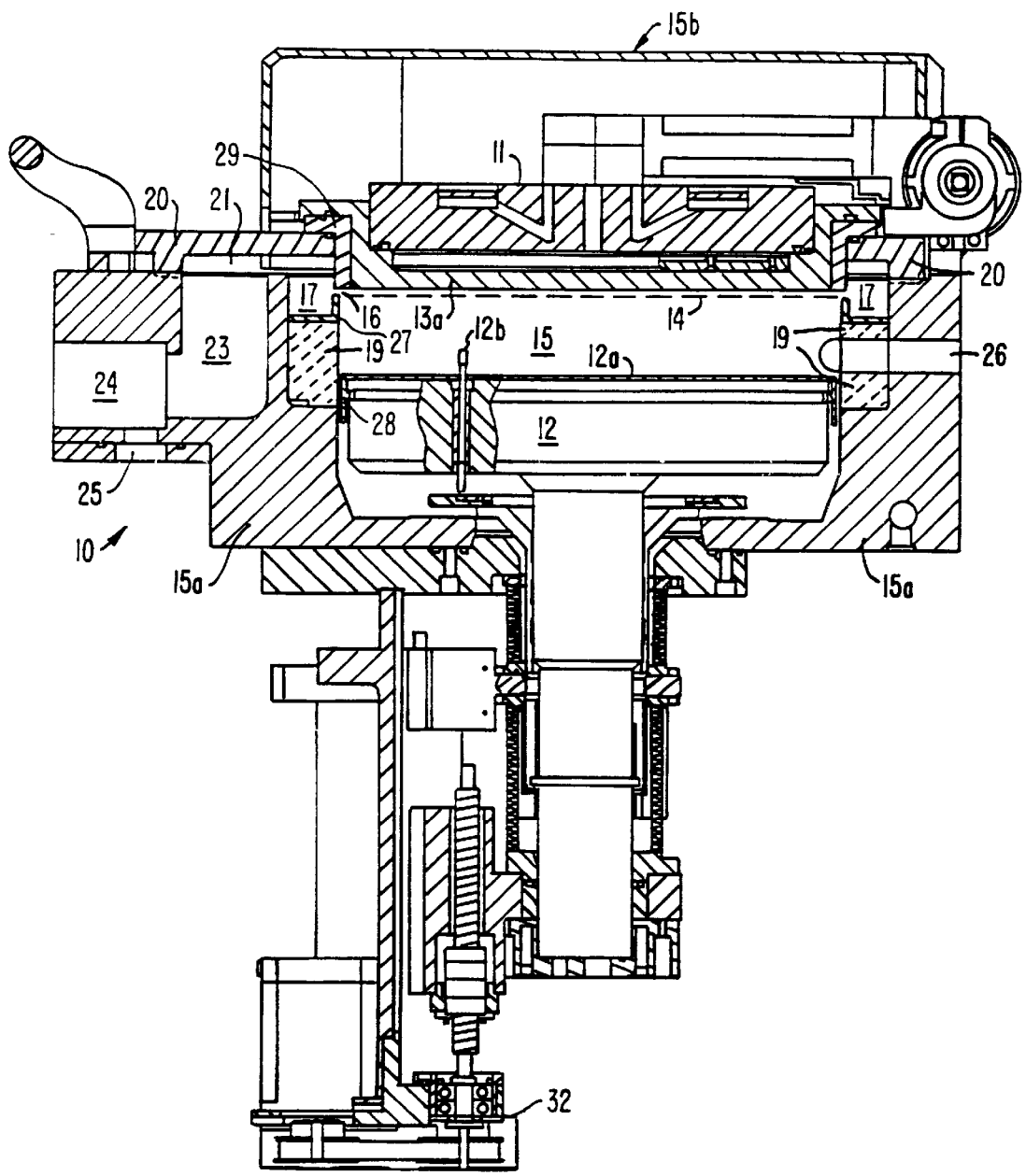
FIGS. 1A and 1B are vertical, cross-sectional views of one embodiment of a simplified chemical vapor deposition apparatus according to the present invention.
Figure 1B:
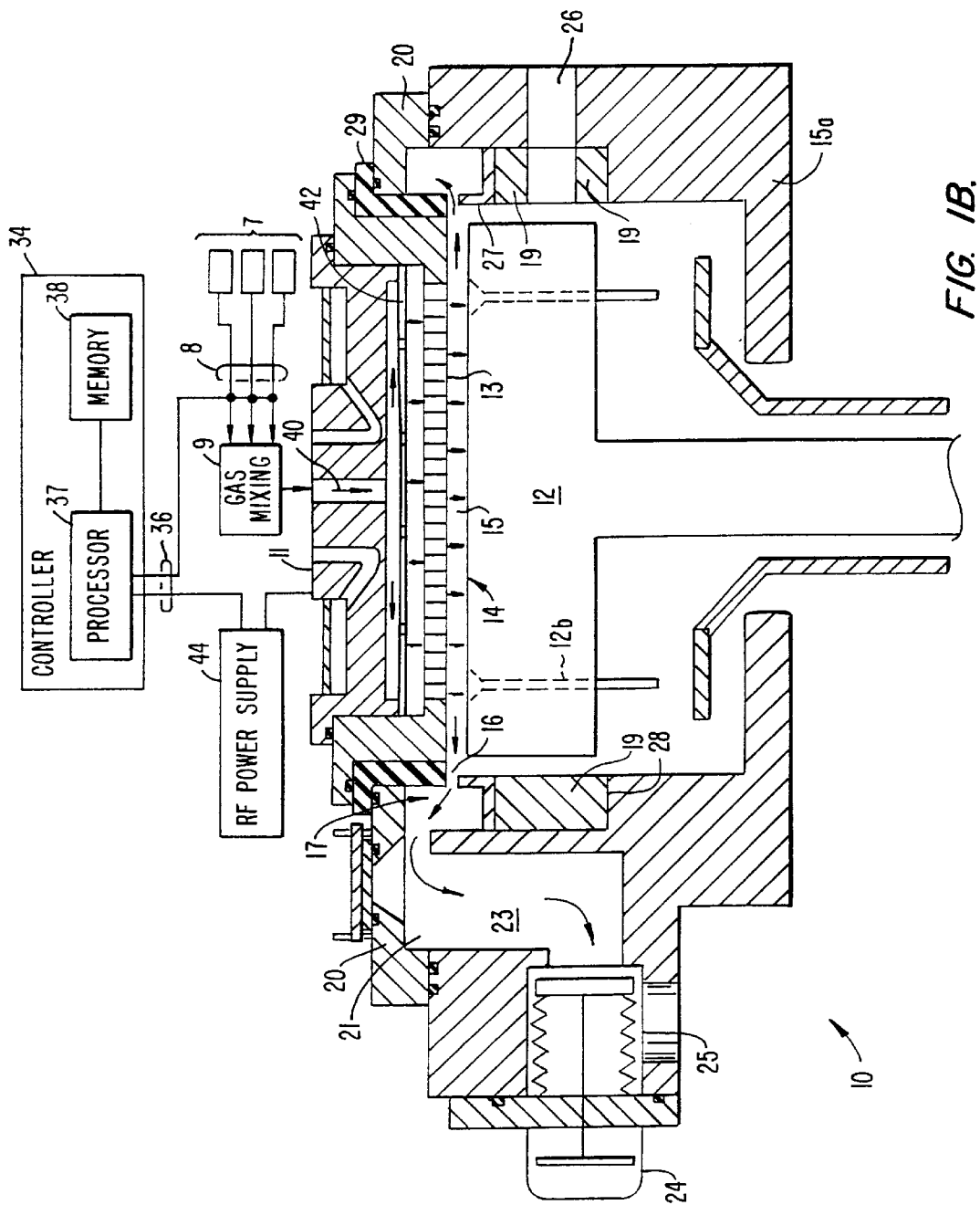
Figure 1D:
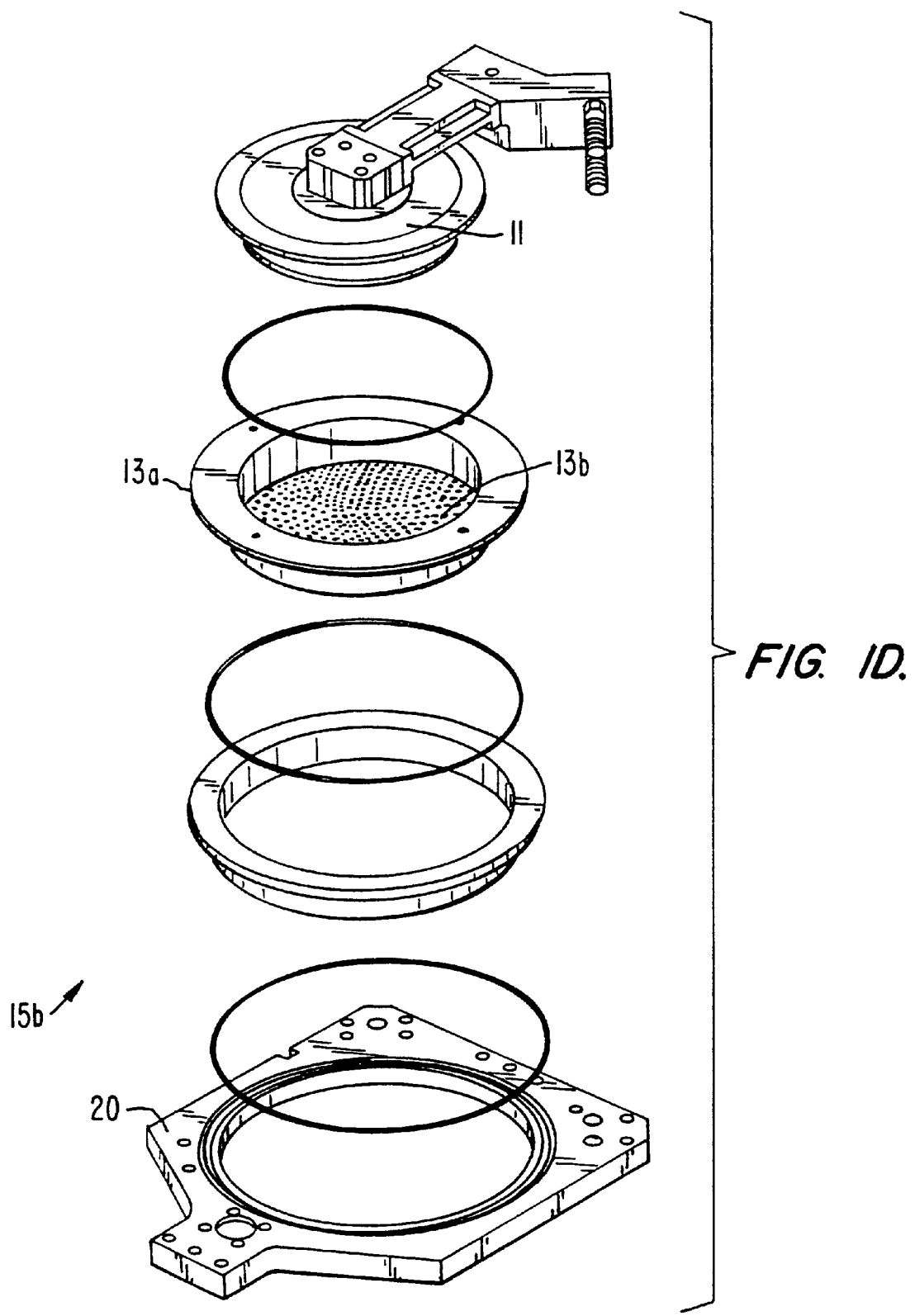

One suitable CVD apparatus in which the method of the present invention can be carried out is shown in FIGS. 1A and 1B, which are vertical, cross-sectional views of a CVD system 10, having a vacuum or processing chamber 15 that includes a chamber wall 15a and chamber lid assembly 15b. Chamber wall 15a and chamber lid assembly 15b are shown in exploded, perspective views in FIGS. 1C and 1D.

CVD system 10 contains a gas distribution manifold 11 for dispersing process gases to a substrate (not shown) that rests on a heated pedestal 12 centered within the process chamber. During processing, the substrate (e.g. a semiconductor wafer) is positioned on a flat (or slightly convex) surface 12a of pedestal 12. The pedestal can be moved controllably between a lower loading/off-loading position (depicted in FIG. 1A) and an upper processing position (indicated by dashed line 14 in FIG. 1A and shown in FIG. 1B), which is closely adjacent to manifold 11. A centerboard (not shown) includes sensors for providing information on the position of the wafers.

Deposition and carrier gases are introduced into chamber 15 through perforated holes 13b (FIG. 1D) of a conventional flat, circular gas distribution or faceplate 13a. More specifically, deposition process gases flow into the chamber through the inlet manifold 11 (indicated by arrow 40 in FIG. 1B), through a conventional perforated blocker plate 42 and then through holes 13b in gas distribution faceplate 13a.

Before reaching the manifold, deposition and carrier gases are input from gas sources 7 through gas supply lines 8 (FIG. 1B) into a mixing system 9 where they are combined and then sent to manifold 11. Generally, the supply line for each process gas includes (i) several safety shut-off valves (not shown) that can be used to automatically or manually shut-off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in CVD system 10 can be either a thermal process or a plasma-enhanced process. In a plasma-enhanced process, an RF power supply 44 applies electrical power between the gas distribution faceplate 13a and the pedestal so as to excite the process gas mixture to form a plasma within the cylindrical region between the faceplate 13a and the pedestal. (This region will be referred to herein as the "reaction region"). Constituents of the plasma react to deposit a desired film on the surface of the semiconductor wafer supported on pedestal 12. RF power supply 44 is a mixed frequency RF power supply that typically supplies power at a high RF frequency (RF1) of 13.56 MHz and at a low RF frequency (RF2) of 360 KHz to enhance the decomposition of reactive species introduced into the vacuum chamber 15. In a thermal process, RF power supply 44 would not be utilized, and the process gas mixture thermally reacts to deposit the desired films on the surface of the semiconductor wafer supported on pedestal 12, which is resistively heated to provide thermal energy for the reaction.

During a plasma-enhanced deposition process, the plasma heats the entire process chamber 10, including the walls of the chamber body 15a surrounding the exhaust passageway 23 and the shut-off valve 24. When the plasma is not turned on or during a thermal deposition process, a hot liquid is circulated through the walls 15a of the process chamber to maintain the chamber at an elevated temperature. Fluids used to heat the chamber walls 15a include the typical fluid types, i.e., water-based ethylene glycol or oil-based thermal transfer fluids. This heating beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction products, is evacuated from the chamber by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360° circular symmetry and uniformity of the slot orifice 16 and the plenum 17 are important to achieving a uniform flow of process gases over the wafer so as to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump (not shown) through a foreline (also not shown).

The wafer support platter of the pedestal 12 (preferably aluminum, ceramic, or a combination thereof) is resistively-heated using an embedded single-loop embedded heater element configured to make two fall turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 12.

Typically, any or all of the chamber lining, gas inlet manifold faceplate, and various other reactor hardware are made out of material such as aluminum, anodized aluminum, or ceramic. An example of such a CVD apparatus is described in U.S. Pat. No. 5,558,717 entitled "CVD Processing Chamber," issued to Zhao et al. The 5,558,717 patent is assigned to Applied Materials, Inc., the assignee of the present invention, and is hereby incorporated by reference in its entirety.

A lift mechanism and motor 32 (FIG. 1A) raises and lowers the heater pedestal assembly 12 and its wafer lift pins 12b as wafers are transferred into and out of the body of the chamber by a robot blade (not shown) through an insertion/removal opening 26 in the side of the chamber 10. The motor 32 raises and lowers pedestal 12 between a processing position 14 and a lower, wafer-loading position. The motor, valves or flow controllers connected to the supply lines 8, gas delivery system, throttle valve, RF power supply 44, and chamber and substrate heating systems are all controlled by a system controller 34 (FIG. 1B) over control lines 36, of which only some are shown. Controller 34 relies on feedback from optical sensors to determine the position of movable mechanical assemblies such as the throttle valve and pedestal, which are moved by appropriate motors under the control of controller 34.

In a preferred embodiment, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular European (VME) standard which defmes board, card cage, and connector dimensions and types. The VME standard also defmes the bus structure as having a 16-bit data bus and a 24-bit address bus.

System controller 34 controls all of the activities of the CVD machine. The system controller executes system control software, which is a computer program stored in a computer-readable medium such as a memory 38. Preferably, memory 38 is a hard disk drive, but memory 38 may also be other kinds of memory. The computer program includes sets of instructions that dictate the timing, mixture of gases, chamber pressure, chamber temperature, RF power levels, pedestal position, and other parameters of a particular process. Other computer programs stored on other memory devices including, for example, a floppy disk or other another appropriate drive, may also be used to operate controller 34.

The interface between a user and controller 34 is via a CRT monitor 50a and light pen 50b, shown in FIG. 1E, which is a simplified diagram of the system monitor and CVD system 10 in a substrate processing system, which may include one or more chambers. In the preferred embodiment two monitors 50a are used, one mounted in the clean room wall for the operators and the other behind the wall for the service technicians. The monitors 50a simultaneously display the same information, but only one light pen 50b is enabled. A light sensor in the tip of light pen 50b detects light emitted by CRT display. To select a particular screen or function, the operator touches a designated area of the display screen and pushes the button on the pen 50b. The touched area changes its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with controller 34.

The process for depositing the film can be implemented using a computer program product that is executed by controller 34. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled WINDOWS™ library routines. To execute the linked, compiled object code the system user invokes the object code, causing the computer system to load the code in memory. The CPU then reads and executes the code to perform the tasks identified in the program.

Figure 1F:
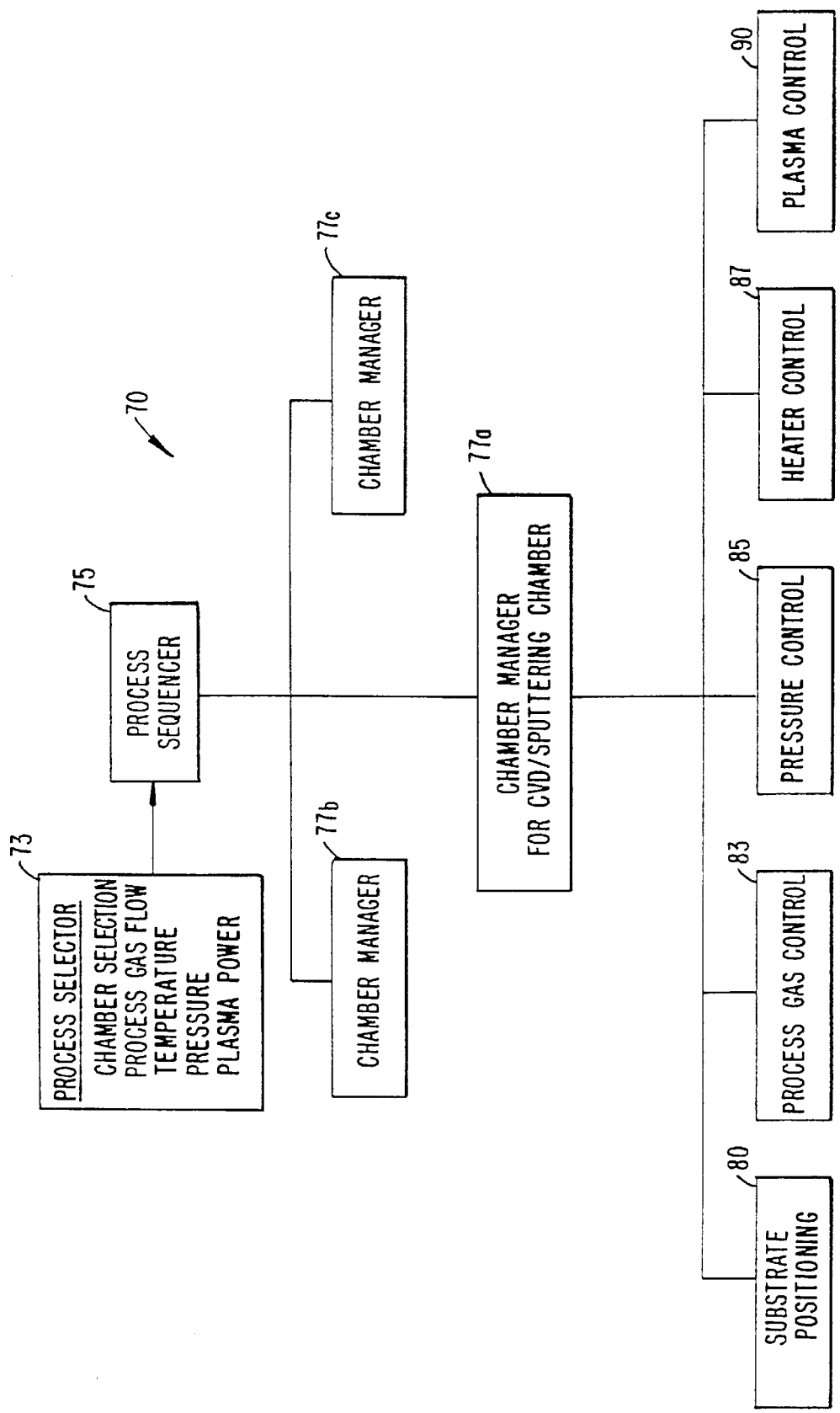
FIG. 1F shows an illustrative block diagram of the hierarchical control structure of the system control software according to a specific embodiment.

FIG. 1F is an illustrative block diagram of the hierarchical control structure of the system control software, computer program 70, according to a specific embodiment. Using the light pen interface, a user enters a process set number and process chamber number into a process selector subroutine 73 in response to menus or screens displayed on the CRT monitor. The process sets are predetermined sets of process parameters necessary to carry out specified processes, and are identified by predefined set numbers. The process selector subroutine 73 identifies (i) the desired process chamber and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and are entered utilizing the light pen/CRT monitor interface.

The signals for monitoring the process are provided by the analog and digital input boards of the system controller, and the signals for controlling the process are output on the analog and digital output boards of CVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably, the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 75 takes into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 initiates execution of the process set by passing the particular process set parameters to a chamber manager subroutine 77a–c, which controls multiple processing tasks in a process chamber 15 according to the process set determined by the sequencer subroutine 75. For example, the chamber manager subroutine 77a comprises program code for controlling sputtering and CVD process operations in the process chamber 15. The chamber manager subroutine 77 also controls execution of various chamber component subroutines that control operation of the chamber components necessary to carry out the selected process set. Examples of chamber component subroutines are substrate positioning subroutine 80, process gas control subroutine 83, pressure control subroutine 85, heater control subroutine 87, and plasma control subroutine 90. Those having ordinary skill in the art will readily recognize that other chamber control subroutines can be included depending on what processes are to be performed in the process chamber 15. In operation, the chamber manager subroutine 77a selectively schedules or calls the process component subroutines in accordance with the particular process set being executed. The chamber manager subroutine 77a schedules the process component subroutines much like the sequencer subroutine 75 schedules which process chamber 15 and process set are to be executed next. Typically, the chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 1F. The substrate positioning subroutine 80 comprises program code for controlling chamber components that are used to load the substrate onto pedestal 12 and, optionally, to lift the substrate to a desired height in the chamber 15 to control the spacing between the substrate and the gas distribution manifold 11. When a substrate is loaded into the process chamber 15, pedestal 12 is lowered to receive the substrate, and thereafter, the pedestal 12 is raised to the desired height in the chamber, to maintain the substrate at a first distance or spacing from the gas distribution manifold during the CVD process. In operation, the substrate positioning subroutine 80 controls movement of pedestal 12 in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates and for activating the safety shut-off valves when an unsafe condition is detected.

In some processes, an inert gas such as helium or argon is flowed into the chamber 15 to stabilize the pressure in the chamber before reactive process gases are introduced. For these processes, the process gas control subroutine 83 is programmed to include steps for flowing the inert gas into the chamber 15 for an amount of time necessary to stabilize the pressure in the chamber, and then the steps described above would be carried out. Additionally, when a process gas is to be vaporized from a liquid precursor, for example, TEOS, the process gas control subroutine 83 is written to include steps for bubbling a delivery gas, such as helium, through the liquid precursor in a bubbler assembly or introducing a carrier gas, such as helium or nitrogen, to a liquid injection system. When a bubbler is used for this type of process, the process gas control subroutine 83 regulates the flow of the delivery gas, the pressure in the bubbler, and the bubbler temperature in order to obtain the desired process gas flow rates. As discussed above, the desired process gas flow rates are transferred to the process gas control subroutine 83 as process parameters. Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 85 comprises program code for controlling the pressure in the chamber 15 by regulating the size of the opening of the throttle valve in the exhaust system of the chamber. The size of the opening of the throttle valve is set to control the chamber pressure to the desired level in relation to the total process gas flow, size of the process chamber, and pumping set-point pressure for the exhaust system. When the pressure control subroutine 85 is invoked, the desired, or target, pressure level is received as a parameter from the chamber manager subroutine 77a. The pressure control subroutine 85 operates to measure the pressure in the chamber 15 by reading one or more conventional pressure manometers connected to the chamber, to compare the measure value(s) to the target pressure, to obtain proportional, integral, and differential (PID) values from a stored pressure table corresponding to the target pressure, and to adjust the throttle valve according to the PID values obtained from the pressure table. Alternatively, the pressure control subroutine 85 can be written to open or close the throttle valve to a particular opening size to regulate the chamber 15 to the desired pressure.

The heater control subroutine 87 comprises program code for controlling the current to a heating unit that is used to heat the substrate 20. The heater control subroutine 87 is also invoked by the chamber manager subroutine 77a and receives a target, or set-point, temperature parameter. The heater control subroutine 87 measures the temperature by measuring voltage output of a thermocouple located in pedestal 12, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. When an embedded loop is used to heat pedestal 12, the heater control subroutine 87 gradually controls a ramp up/down of current applied to the loop. Additionally, a built-in fail-safe mode can be included to detect process safety compliance, and can shut down operation of the heating unit if the process chamber 15 is not properly set up.

The plasma control subroutine 90 comprises program code for setting the low and high frequency RF power levels applied to the process electrodes in the chamber 15, and for setting the low frequency RF frequency employed. Similar to the previously described chamber component subroutines, the plasma control subroutine 90 is invoked by the chamber manager subroutine 77a.

The above reactor description is mainly for illustrative purposes, and other plasma CVD equipment such as electron cyclotron resonance (ECR) plasma CVD devices, induction coupled RF high density plasma CVD devices, or the like may be employed. Additionally, variations of the above-described system, such as variations in pedestal design, heater design, RF power frequencies, location of RF power connections and others are possible. For example, the wafer could be supported by a susceptor and heated by quartz lamps. The layer and method for forming such a layer of the present invention is not limited to any specific apparatus or to any specific plasma excitation method.

II. Exemplary Structure

Figure 2:
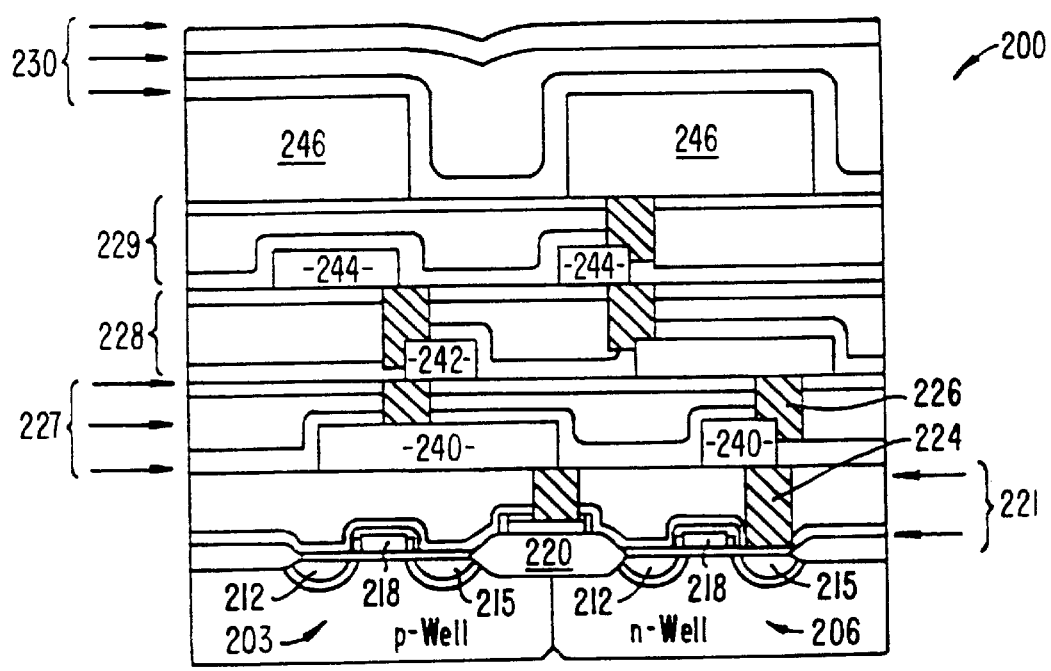
FIG. 2 is a simplified cross-sectional view of an integrated circuit 600 according to the present invention.

FIG. 2 illustrates a simplified cross-sectional view of an integrated circuit 200 according to the present invention. As shown in FIG. 2, integrated circuit 200 includes NMOS and PMOS transistors 203 and 206, which are separated and electrically isolated from each other by a field oxide region 220. Each of transistors 203 and 206 comprises a source region 212, a gate region 215, and a drain region 218.

A premetal dielectric layer 221 separates transistors 203 and 206 from metal layer 240, with connections between metal layer 240 and the transistors made by contacts 224. Metal layer 240 is one of four metal layers, 240, 242, 244, and 246 included in integrated circuit 200. Each metal layer is separated from adjacent metal layers by intermetal dielectric layers 227, 228, and 229. Adjacent metal layers are connected at selected openings by vias 226. Deposited over metal layer 246 are planarized passivation layers 230.

The layer of the present invention may find uses in each of the dielectric layers shown in integrated circuit 200. The layer of the present invention may also be used in damascene layers, which are included in some integrated circuits. In damascene layers, a blanket layer is deposited over a substrate, selectively etched through to the substrate, and then filled with metal and etched back or polished to form metal contacts such as 224. After the metal layer is deposited, a second blanket deposition is performed and selectively etched. The etched areas are then filled with metal and etched back or polished to form vias 226.

It should be understood that the simplified integrated circuit 200 is for illustrative purposes only. One of ordinary skill in the art could implement the present method for fabrication of other integrated circuits, such as microprocessors, application-specific integrated circuits (ASICs), memory devices, and the like.

III. Exemplary Low-Dielectric Constant Layer

Dielectric layers deposited in accordance with embodiments of the present invention have a low dielectric constant. This low dielectric constant results from pores that are intentionally induced in a portion of the layer. The spaces defined by the pores have a lower dielectric constant than the host material, which is silicon oxide, and thus reduce the dielectric constant of the layer below that of a similar layer without the pores. Such a dielectric layer may be used as an intermetal dielectric (IMD) layer or other type of dielectric layer. The specific example below describes an IMD layer formed over aluminum alloy traces, which may be as close together as 0.25 microns and have an aspect ratio of at least 4:1. Therefore, this layer not only has a lowered dielectric constant, but also has excellent gap-filling properties and is compatible with pre-existing aluminum structures on a semiconductor substrate.

Figure 3:
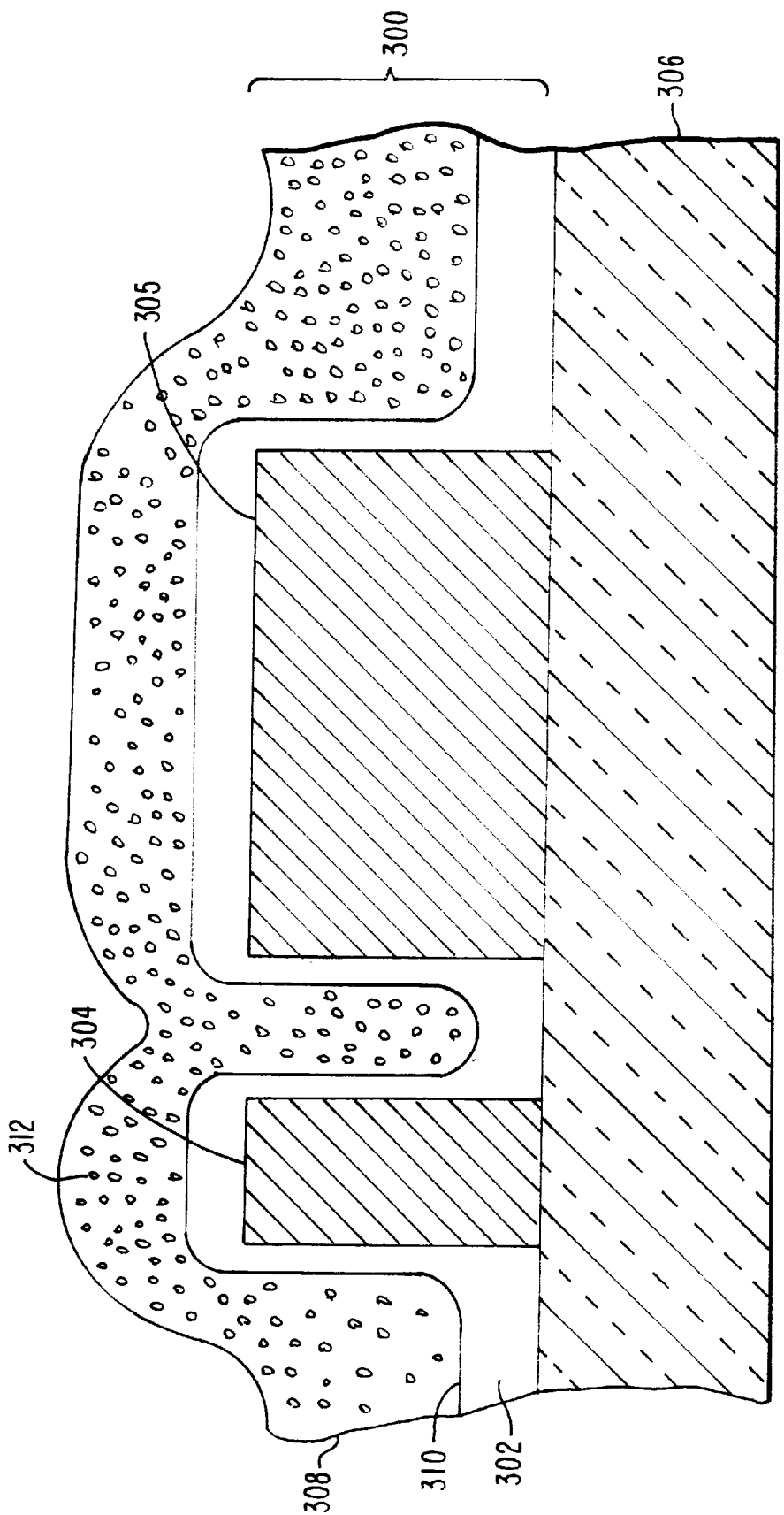
FIG. 3 is a simplified cross-sectional view of a layer according to an embodiment of the present invention.

FIG. 3 is a simplified cross-section of an embodiment of the present invention with a two-layer silicon oxide film 300. A PECVD layer 302 of silicon oxide or doped silicon oxide is deposited over the conductive traces 304, 305 and substrate 306. The substrate 306 could be, for example, a silicon wafer or a silicon wafer with existing structures or layers. This PECVD layer acts as a diffusion barrier and also is a compressive layer, which improves the reliability of the underlying metal traces, especially with regard to metal cracking and electromigration failures. An SACVD layer 308 of silicon oxide is deposited over the PECVD layer after treating the surface of the PECVD layer 310 to enhance the surface sensitivity of the PECVD layer to TEOS. Proper surface treatment of the PECVD layer results in pores 312 being formed in the SACVD layer as it is deposited. An optional capping layer (not shown) may be deposited to seal the SACVD layer and provide a surface that is compatible with typical subsequent semiconductor processes.

Conventional processes which deposit an SACVD layer over a PECVD layer typically seek to reduce or eliminate the surface sensitivity of the PECVD layer to TEOS, whereas the intent in this instance is to enhance surface sensitivity. Prior processes sought to reduce or eliminate surface sensitivity to improve the film quality and rate of deposition of the SACVD layer. Although the exact reason why SACVD films deposited on PECVD are sensitive to the surface of the PECVD layer is not known, it is believed that surface sensitivity arises due to the hydrophilic nature of the PECVD surface and the hydrophobic nature of TEOS molecules. One method for reducing the surface sensitivity uses a low-power plasma, such as an argon or nitrogen plasma, to create imperfections on the surface of the PECVD layer that the SACVD can stick to. The present process enhances surface sensitivity by treating the PECVD surface with activated oxygen, either in the form of an oxygen plasma or ozone. It is believed that this surface treatment enhances the hydrophobic characteristic of the PECVD surface by eliminating dangling silicon bonds that might otherwise provide a nucleation site for the SACVD layer.

After treating the surface of the PECVD layer with activated oxygen, a subsequently deposited SACVD layer exhibits significant porosity. This porosity lowers the dielectric constant of the SACVD layer, and thus lowers the combined dielectric constant of the PECVD-SACVD layer. The pores are approximately 100–500 Å in diameter and, surprisingly, persist in the SACVD layer for at least 1 micron from the interface between the PECVD and SACVD layers. This allows the pores to lower the dielectric constant of the SACVD layer for a significant portion of the trench being filled. For example, a 0.25-micron gap with a 4:1 aspect ratio would be 1 micron high. The PECVD liner layer would fill some of the gap, leaving less than 1 micron to be filled with SACVD, all of which may be porous.

Figure 4:
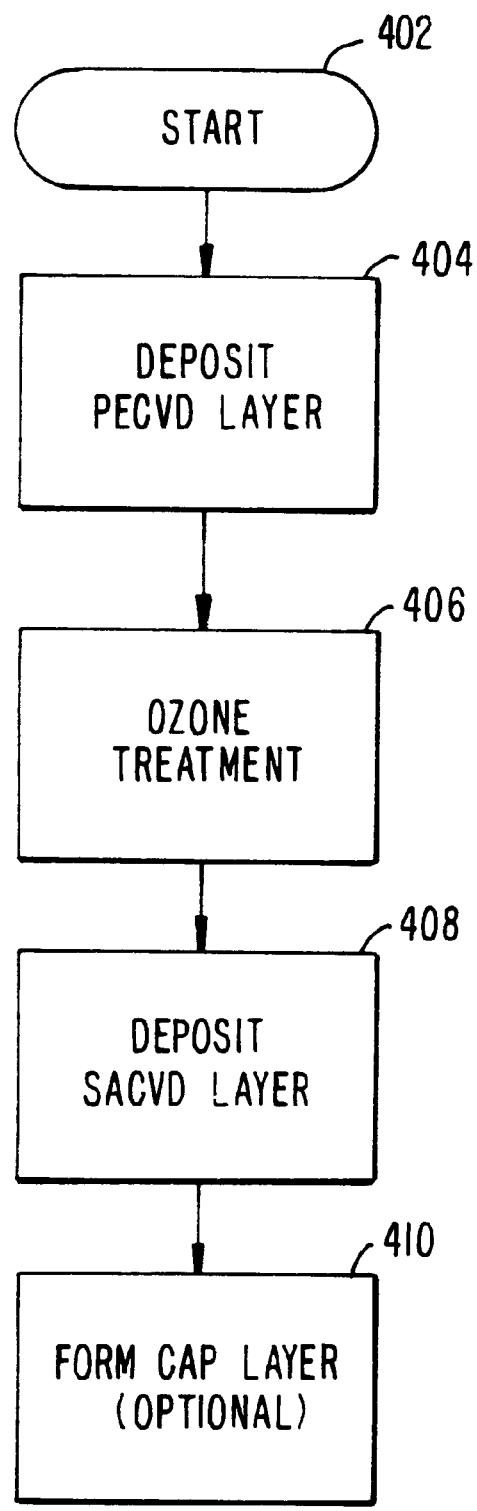
FIG. 4 is a flow chart illustrating steps undertaken in formation of a film according to one embodiment of the method of the present invention.

FIG. 4 is a flow chart of one embodiment according to the present invention in which ozone is used as a source of activated oxygen to enhance the surface sensitivity of a PECVD layer. In this embodiment, the processing is accomplished within a single processing chamber, but it is understood that the process could be adapted to a multichamber system, or could be performed in a series of different chambers or systems. Similarly, the process parameters described below are for an 8-inch process wafer, but the process could be modified to accommodate other wafers.

A wafer is loaded onto the pedestal in the processing chamber (step 402) through a vacuum-lock door, or slit valve, and moved to the desired processing position. A process gas including TEOS and diatomic oxygen ($O_2$) is introduced into the chamber and a plasma is formed to deposit a layer of PECVD silicon oxide (step 404) over the wafer. Helium, acting as a carrier gas, is bubbled through liquid TEOS that is heated to about 35–45° C. to provide TEOS vapor to the reaction chamber. During the PECVD process, the pressure in the chamber is set and maintained at about 1–20 Torr and the chamber is heated to a temperature of about 200–500° C. Preferably, chamber pressure is maintained at between about 6–12 Torr and temperature is maintained between about 360–440° C. The plasma may be formed by the application of either single- or mixed-frequency RF power. When a mixed-frequency RF power source is used, the high-frequency RF source of 13.56 MHz is driven at between about 150–1000 W and preferably at about 600–800 W; and a low-frequency RF source of about 200 KHz to 2 MHz is driven at about 50–500 W and preferably at about 50–150 W. Process conditions are maintained to form a PECVD layer about 100 Å to 2000 Å thick, preferably about 1000 Å thick. The recited thickness is sufficient to act as a barrier layer and to provide a compressive film over metal structure, if any, that were on the wafer prior to the PECVD deposition step.

After forming the PECVD liner layer, the surface of the PECVD layer is treated with ozone to enhance its surface sensitivity (step 406). A mixture of about 1–20 weight-percent, preferably about 12 weight-percent, ozone in diatomic oxygen is flown into the chamber at a total flow rate of between about 50 sccm-10 slm at a pressure of about 0.5–500 Torr, preferably about 5 Torr, for a period between about 10 seconds and 10 minutes, preferably 2–3 minutes. A high throughput of wafers through the processing system is desirable, therefore the period of treatment should be kept as short as possible, while still providing enhanced surface sensitivity. The exact time required will depend on many factors, including the how the preceding PECVD process was performed. The wafer is heated to a temperature of about 400° C. to increase the rate of surface sensitivity enhancement and to prepare for the subsequent SACVD process. The optimum time depends upon the ozone concentration and PECVD processing conditions, among other factors. The elimination of dangling silicon bonds remaining after the PECVD process is the desired result, and the number of these dangling bonds may depend on the plasma power, relative concentrations of precursor gases, gas flow rate, and other factors used during the PECVD process. For example, the PECVD process may leave unreacted TEOS on the surface of the silicon oxide layer and this residual TEOS may scavenge the ozone before it has a chance to eliminate the dangling silicon bonds. Therefore, the exact surface sensitization process conditions depend to some extent on the preceding PECVD process.

After the PECVD silicon oxide surface has been sensitized by exposure to ozone, a layer of SACVD silicon oxide is formed over the PECVD layer (step 408). SACVD layers have good conformal gap-filling properties, but typically do not adhere well to underlying metal structures, do not provide a good barrier against corrosion of the metal, and are tensile, rather than compressive. The SACVD layer is formed by reacting a mixture of TEOS and ozone on the surface of the PECVD layer. The wafer is heated to about 300–480° C., and preferably to about 380–420° C. The chamber pressure is maintained at about 200–700 Torr, preferably at about 350–500 Torr, until the desired layer is formed. The porosity of the resulting SACVD layer provides a layer with a lower dielectric constant than would have resulted if the surface sensitivity of the PECVD layer has not been enhanced. However, enhancing the surface sensitivity of the PECVD layer may result in a lower rate of deposition for the SACVD layer. For example, enhancing the surface sensitivity of the PECVD layer may reduce the base SACVD deposition rate (the deposition rate that one would achieve without enhancing surface sensitivity) from typically around 2000 Å/min. by about 10–50%, typically reducing the base SACVD deposition rate by about 25%. Of course, processing conditions will vary according to the desired characteristics of the deposited film, as will the base deposition rate.

Optionally, a cap layer may be deposited over the SACVD layer (step 410). A cap layer may be formed using a PECVD process similar to the PECVD process described above. The cap layer is not necessary to achieve the lower dielectric constant of the underlying layer, but may make the SACVD layer more compatible with subsequent integrated circuit processing steps. The SACVD layer may be planarized or densified prior to the formation of a cap layer.

Figure 5:
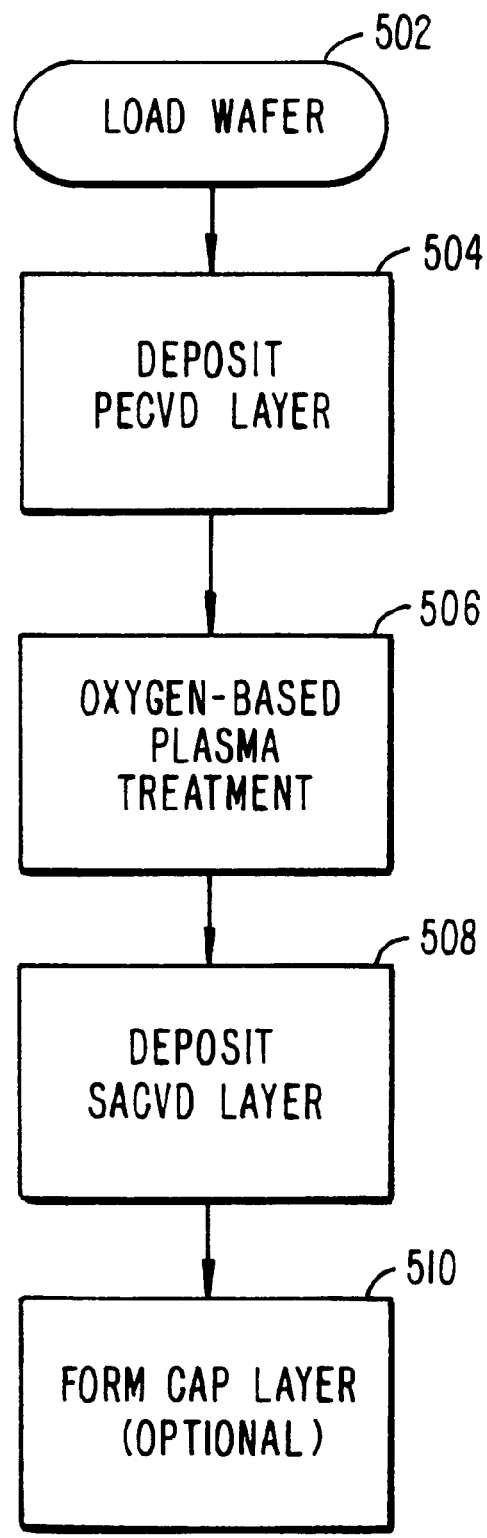
FIG. 5 is a flow chart illustrating steps undertaken in formation of a film according to another embodiment of the method of the present invention.

FIG. 5 is a simplified flow chart of an alternative embodiment of the present invention in which an oxygen-based plasma is used to enhance the surface sensitivity of the PECVD layer. A wafer is loaded into the processing chamber (step 502) and a layer of PECVD silicon oxide is formed (step 504) substantially as described above. The surface of the PECVD layer is sensitized by exposing the PECVD layer to a plasma formed from diatomic oxygen, ozone, or other oxygen source (step 506). Radio-frequency (RF) energy forms a plasma from the oxygen and/or ozone within the chamber. The RF energy can be supplied in either a dual or mixed-frequency mode. In the mixed-frequency mode, between 100–1000 W of power at 13.56 MHz and between 100–1000 W of power at 350 kHz may be supplied to a chamber at a pressure of about 0.5–10 Torr, preferably about 2–6 Torr. The total power preferably is about 250–1000 W, which is believed sufficient to combine oxygen species in the plasma with dangling silicon bonds on the surface of the PECVD layer. The surface of the PECVD layer is exposed to this plasma for about 10–100 seconds, depending on the nature and condition of the surface of the PECVD layer, as discussed above. After the surface of the PECVD layer has been sensitized, an SACVD layer is deposited (step 508), substantially as described above. An optional cap layer may be formed (step 510) over the SACVD layer.

In either process, fluorine may be incorporated into the PECVD liner layer, a PECVD cap layer, or both. It is believed that the incorporation of fluorine into the PECVD liner layer increases the surface sensitivity of that layer, thus simplifying or shortening the time required to enhance the surface sensitivity using activated oxygen. Several different processes for forming fluorinated silicon glass (FSG) are know. One such process uses triethoxyfluorosilane (TEFS) in a ratio of about 0.33–10:1 with TEOS in the PECVD deposition process. Such a process produced a deposition rate of 3000–7000 Å/min. and an FSG film having a compressive stress level of between about 0.5 to $3.0 \times 10^9$ dynes/cm$^2$. The FSG film can have an atomic fluorine concentration of 0.5–15%, but preferably about 0.5–6% and most preferably 1.0–4.0%, as measured with a Fourier transform infrared (FTIR) spectroscopy method.

The exemplary TEFS-FSG bulk film is deposited by heating the wafer to a temperature of 200–500° C., preferably to a temperature within the range of 350–500° C., and most preferably to about 400° C., and maintaining this temperature range throughout the deposition. The reaction chamber is maintained at a pressure range of about 1–50 Torr. Preferably, the pressure is maintained at about 3–16 Torr, and most preferably at about 5 Torr. The wafer is positioned about 200–600 mil from the gas distribution manifold, preferably about 250 mil.

A mixture comprising TEFS as the source of fluorine, TEOS, and one or more gaseous sources of oxygen is formed. Being liquids, the TEFS and TEOS sources are vaporized and then combined with an inert carrier gas, such as helium. The flow rate of TEFS is about 200–1500 mgm and is preferably about 300–900 mgm, and is most preferably at about 850 mgm, while the TEOS flow rate is about 400–1500 mgm and preferably about 260 mgm. The vaporized TEOS and TEFS gases then are mixed with a helium carrier gas flowing at a rate of 400–1500 sccm and are preferably flowing at a rate of about 560 sccm. Oxygen in the form of $O_2$ is introduced at a flow rate of about 100–5000 sccm and is preferably introduced at a flow rate of about 1200 sccm. The total flow rate of all gaseous sources is 500–6500 sccm and is preferably about 1500–2500 sccm. This mixture is introduced into the reaction chamber from the gas distribution manifold and excited into a plasma state. The plasma is formed using a frequency of 13.56 MHz at 0–500 W, preferably about 155 W, and a low radio frequency 10 kHz to 2 MHz, preferably about 350 kHz powered at about 0–900 W, preferably about 230 W.

An alternative process for forming an FSG film uses $C_2F_6$ as the fluorine source. The $C_2F_6$-FSG PECVD film is deposited by heating the wafer to a temperature of 200–500° C., preferably to a temperature within the range of 350–500° C. and most preferably to about 400° C., and maintaining this temperature range throughout the deposition. Electrode spacing ranges from about 200 to 600 mil, and is preferably at about 250 mil.

A gaseous mixture comprising $C_2F_6$ as the gaseous source of fluorine, TEOS as the source of silicon, and one or more gaseous sources of oxygen are introduced into the reaction chamber from the gas distribution manifold and an RF plasma is formed. The plasma is formed using a high radio frequency of 13.56 MEz at 0–500 W, and preferably at about 200 W, and a low radio frequency between 10 kHz to 2 MHz, preferably about 350 kHz at about 0–900 W and preferably at about 430 W.

The TEOS source is first vaporized and then combined with an inert carrier gas such as helium. The flow rate of TEOS is about 400–1500 mgm and preferably at a rate of about 600 mgm. After being vaporized, the TEOS gas source then is mixed with a helium carrier gas at a rate of 400–1500 sccm and preferably at a rate of about 760 sccm. $C_2F_6$ is introduced at a flow rate of 100–900 sccm and is preferably introduced at a rate of about 400 sccm. Oxygen in the form of $O_2$ is introduced at a rate of about 100–5000 sccm and preferably at a rate of about 1200 sccm.

The reaction chamber is maintained at a pressure within a range of about 1–50 Torr, preferably at a pressure within the range of about 3–16 Torr and most preferably at a pressure of about 5 Torr. The ratio of $C_2F_6$ to TEOS is about 1–25:1 and preferably about 5–15:1, while the total flow rate of all gaseous sources is 500–6200 sccm and is preferably about 2000–3000 sccm.

The above process conditions result in an FSG film deposited at a rate of 3000–6000 Å/minute having a compressive stress level of 0–2.0×10⁹ dynes/cm², a wet etch ratio with respect to the thermal oxide film of 3–5 for 6:1 BOE etchant, and an atomic fluorine concentration of 0.5–15%. Preferably, the fluorine concentration level is about 0.5–6% SiF and is most preferably about 1.0–4.0%.

The invention has now been described with reference to the preferred embodiments and specific examples. Alternatives and substitutions will now be apparent to persons of skill in the art. For example, the surface sensitivity of a PECVD layer to TEOS may be enhanced by a fluorine treatment to reduce the number of dangling silicon bonds, or the surface of the SACVD layer may be thermally treated or treated with a plasma to improve the quality of that surface. Accordingly, it is not intended to limit the invention except as provided in the appended claims.

What is claimed is:

1. A method for reducing a dielectric constant of a film of silicon oxide on a substrate, the method comprising:
   (a) forming a first layer of silicon oxide on the substrate in a chamber using a plasma-enhanced chemical vapor deposition process;
   (b) thereafter, enhancing a surface sensitivity of a surface of the first layer by exposing the surface to activated oxygen to form a sensitized surface; and
   (c) thereafter, forming a second layer of porous silicon oxide on the sensitized surface from a hydrophobic silicon source using a subatmospheric chemical vapor deposition process.

2. The method of claim 1 wherein the hydrophobic silicon source comprises tetraethylorthosilane.

3. The method of claim 1 wherein the activated oxygen comprises ozone.

4. The method of claim 1 wherein the activated oxygen is formed in an oxygen-based plasma.

5. The method of claim 4 wherein the oxygen-based plasma is maintained at a pressure above about 2 Torr.

6. The method of claim 4 wherein the oxygen-based plasma is maintained at a power level above about 5 W/square inch of a surface area of the substrate.

7. The method of claim 1 wherein the first layer further includes fluorine.

8. The method of claim 1 further comprising after forming said second layer:
   (d) forming a capping layer over the second layer, the capping layer being formed by a plasma-enhanced chemical vapor deposition process.

9. A method of forming a multilayer silicon oxide dielectric film over a substrate, said method comprising:
   (a) forming a first layer of silicon oxide over the substrate using a plasma CVD process;
   (b) thereafter, exposing a surface of the first silicon oxide layer to activated oxygen; and
   (c) thereafter, forming a second layer of silicon oxide on the first layer using a thermal CVD process.

10. The method of claim 9 wherein said first layer of silicon oxide is formed from a process gas comprising TEOS and diatomic oxygen.

11. The method of claim 10 wherein said second layer of silicon oxide is formed from a process gas comprising TEOS and ozone.

12. The method of claim 9 wherein said surface of the first silicon oxide layer is exposed to activated oxygen for between 10 seconds and 10 minutes before said second layer is formed.

13. The method of claim 9 wherein the exposing step exposes the surface of the first silicon oxide layer to a plasma formed from a gas consisting essentially of oxygen.

14. The method of claim 9 wherein the exposing step exposes the surface of the first silicon oxide layer to a gas comprising between 1–20 weight percent ozone in diatomic oxygen.

* * * * *